US012670950B2

(12) United States Patent
Verma et al.

(10) Patent No.: US 12,670,950 B2
(45) Date of Patent: Jun. 30, 2026

(54) BIT CELL BASED WRITE SELF-TIME DELAY PATH

(71) Applicant: STMicroelectronics International N.V., Geneva (CH)

(72) Inventors: Praveen Kumar Verma, Greater Noida (IN); Anuj Dhillon, New Delhi (IN)

(73) Assignee: STMicroelectronics International N.V., Geneva (CH)

( * ) Notice: Subject to any disclaimer, the term of this patent is extended or adjusted under 35 U.S.C. 154(b) by 91 days.

(21) Appl. No.: 18/614,460

(22) Filed: Mar. 22, 2024

(65) Prior Publication Data

US 2024/0331767 A1 Oct. 3, 2024

Related U.S. Application Data

(60) Provisional application No. 63/492,937, filed on Mar. 29, 2023.

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ............................. G11C 11/418; G11C 11/419
USPC .................................................... 365/189.011
See application file for complete search history.

(56) References Cited

U.S. PATENT DOCUMENTS

| | | | |
|---|---|---|---|
| 9,324,392 B1 | 4/2016 | Asenov et al. | |
| 9,721,650 B1 | 8/2017 | Raj et al. | |
| 10,734,067 B1 * | 8/2020 | Akamatsu .............. | G11C 7/106 |
| 2013/0322193 A1 | 12/2013 | Sahu et al. | |
| 2014/0133219 A1 * | 5/2014 | Wu ........................ | G11C 11/419 |
| | | | 365/156 |
| 2014/0293679 A1 * | 10/2014 | Behrends ................. | G11C 7/20 |
| | | | 365/154 |
| 2015/0146476 A1 * | 5/2015 | Zhang ................... | G11C 11/419 |
| | | | 365/189.16 |
| 2019/0279707 A1 | 9/2019 | Pathak et al. | |
| 2021/0020225 A1 * | 1/2021 | Dubey ................ | G11C 11/5628 |

OTHER PUBLICATIONS

Arslan et al., "Variation-Tolerant SRAM Sense-Amplifier Timing Using Configurable Replica Bitlines," 2008 *IEEE Custom Integrated Circuits Conference,* Date of Conference Sep. 21-24, 2008, pp. 415-418. (4 pages).

* cited by examiner

*Primary Examiner* — Sung Il Cho
(74) *Attorney, Agent, or Firm* — Seed Intellectual Property Law Group LLP

(57) ABSTRACT

The present disclosure is directed to a device and method for accurately estimating a write self-time of a memory array. The write self-time is estimated by performing a simulated write operation on a write self-time bit cell having the same structure and arrangement as each of the bit cells of the memory array. The write operations on the bit cells of the memory array are stopped in response to detecting completion of the simulated write operation.

20 Claims, 3 Drawing Sheets

BIT CELL BASED WRITE SELF-TIME DELAY PATH

BACKGROUND

Technical Field

The present disclosure is directed to a write self-time delay path for memory devices.

Description of the Related Art

Many memory devices, such as static random access memories (SRAMs), include various write self-time schemes to track a write operation. The write self-time is an estimation of the time it takes to perform a successful write operation to a bit cell of a memory array. The write self-time is used to trigger a reset operation for after the write operation is complete to guarantee that appropriate data is written in the memory.

Current memory devices track the write self-time using an alternative path that replicates the duration of an actual write operation. For example, current memory devices introduce a write self-time delay for triggering the reset operation using logic and/or resistor-capacitor (RC) delay techniques, such as two inverters electrically coupled in series. After a write operation is initiated, the reset operation is delayed until expiration of the write self-time delay.

Accurate estimation of the write self-time involves rigorous validation as components (e.g., logic, bit cells, etc.) of the memory device and components for the logic and/or resistor-capacitor (RC) delay techniques are susceptible to operating conditions. For example, the execution time of a write operation and the delay of the logic and/or resistor-capacitor (RC) delay techniques may be faster or slower depending on process, voltage, and temperature (PVT) conditions of the memory device. Further, the components of the memory device and the components for the logic and/or resistor-capacitor (RC) delay techniques may be affected differently by the same PVT conditions due to utilizing different electronic components, which have different device characteristics.

Any mismatch between the write self-time and the write operation may impact functionality and performance of the memory device. For example, if the write self-time delay is less than the time duration for a successful write operation, the reset operation will occur before data has been property written to the bit cell. Consequently, data will not be written as intended. Conversely, if the write self-time delay is more that the time duration for a successful write operation, the memory device will be operating longer than is necessary. As a result, the memory device will unnecessarily consume power and possibly delay other operations.

To ensure a write operation has enough time to be successfully completed before triggering the reset operation, current devices generally tune the write self-time delay with large margins to account for worst case PVT conditions. The use of such large margins, however, often results in loss in power and performance due to the unnecessary delay in the reset operation in cases where the write operation may be performed quickly.

BRIEF SUMMARY

The present disclosure is directed to a device and method for accurately estimating a write self-time of a memory array. The write self-time is an estimation of time it takes to perform a successful write operation to each of the bit cells of the memory array. Write operations on the bit cells of the memory array are stopped based on the estimated write-self-time.

The write self-time is estimated by performing a simulated write operation on a write self-time bit cell having the same structure and arrangement as each of the bit cells of the memory array. The write operations on the bit cells of the memory array are stopped in response to detecting completion of the simulated write operation.

As the write self-time bit cell has the same structure and arrangement as each of the bit cells of the memory array, the simulated write operation performed on the write self-time bit cell and write operations performed on the memory array are affected by PVT conditions in a similar manner. As such, the time duration to complete the simulated write operation provides an accurate estimate of the write self-time of each of the bit cells of the memory array, regardless of PVT conditions. Accordingly, the risk of stopping write operations to the bit cells of the memory array based on the estimated write-self-time prematurely or late is minimized.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of operation and manufacturing of electronic components and memory devices have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

As discussed above, current devices generally tune the write self-time delay with large margins to account worst case PVT conditions. The use of such large margins, however, often results in loss in power and performance due to the unnecessary delay in the reset operation in cases where the write operation may be performed quickly without being affected by PVT conditions.

The present disclosure is directed to a device and method for accurately tracking a write self-time of a memory device. Various embodiments disclosed herein utilize one or more write self-time bit cells to track or estimate the time it takes to perform a successful write operation to a bit cell of a memory array. The write self-time is used to trigger a reset operation for stopping the write operation to the bit cell of the memory array. Utilization of the write self-time bit cell provides accurate and dynamic estimation of the write self-time delay. As a result, loss in power and performance due to the unnecessary delays in reset operations and data loss due to premature reset operations are minimized.

Figure 1:
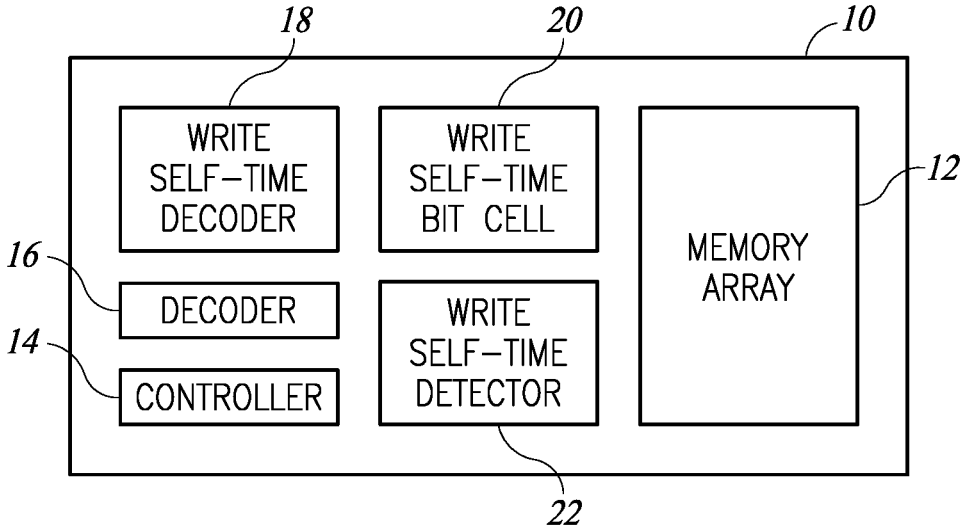
FIG. 1 is a block diagram of a memory device according to an embodiment disclosed herein.

FIG. 1 is a block diagram of a memory device 10 according to an embodiment disclosed herein.

The memory device 10 may be any type of embedded memory device. In one embodiment, the memory device 10 is a static random access memory (SRAM). The memory device 10 includes a memory array 12, a controller 14, a decoder 16, a write self-time decoder 18, a write self-time bit cell 20, and a write self-time detector 22. In one embodiment, the memory array 12, the controller 14, the decoder 16, the write self-time decoder 18, write self-time bit cell 20, and the write self-time detector 22 are part of the same memory architecture and fabricated in the same substrate.

The memory array 12 is a data structure for storing data. The memory array 12 includes an array of bit cells with each bit cell storing one bit of data. The bit cells are arranged, for example, in a plurality of rows and columns. As will be discussed in further detail below, each of the bit cells has the same structure or arrangement of the write self-time bit cell 20.

The controller 14 is communicatively coupled to the decoder 16 and the write self-time detector 22. The controller 14 manages the memory device 10. The controller 14, for example, controls the storing and reading of data into the memory array 12, and generates clock signals for the decoder 16 and the write self-time decoder 18.

The controller 14 is configured to start and stop a write operation to the memory array 12. To start the write operation to the memory array 12, the controller 14 instructs the decoder 16 to transmit a word line signal to the memory array 12. The controller 14 instructs the decoder 16 with, for example, an interrupt or clock signal. To end the write operation, the controller 14 instructs the decoder 16 to stop transmitting the word line signal to the memory array 12. The controller 14 instructs the decoder 16 by, for example, stopping the interrupt or clock signal.

The decoder 16 is communicatively coupled to the write self-time decoder 18 and the memory array 12. The decoder 16 selects and accesses a particular row or column of bit cells of the memory array 12 for a write operation by transmitting the word line signal to the memory array 12. As discussed above, the decoder 16 is instructed by the controller 14 to transmit a word line signal to the memory array 12.

Upon receiving the word line signal from the decoder 16 (e.g., the word line signal having a high state), the memory array 12 performs a write operation to bit cells of the memory array 12. Conversely, upon no longer receiving the word line signal from the decoder 16 (e.g., the word line signal having a low state), the memory array 12 stops the write operation to the bit cells of the memory array 12.

When a write operation is started by the controller 14 and the decoder 16 transmits the word line signal to the memory array 12, the decoder 12 concurrently instructs the write self-time decoder 18 to transmit a secondary word line signal to the write self-time bit cell 20. The word line signal and the secondary word line signal are concurrently transmitted to the memory array 12 and the write self-time bit cell 20, respectively.

The write self-time decoder 18 is communicatively coupled to the decoder 16 and the write self-time bit cell 20. The write self-time decoder 18 selects and accesses the write self-time bit cell 20 for a simulated write operation by transmitting a secondary word line signal to the write self-time bit cell 20. As discussed above, the write self-time decoder 18 receives instruction from the decoder 12 to transmit the secondary word line signal to the write self-time bit cell 20.

The secondary word line signal is a dummy word line signal that simulates the word line signal transmitted from the decoder 16 to the memory array 12. In one embodiment, the word line signal and the secondary word line signal are transmitted to the memory array 12 and the write self-time bit cell 20, respectively, concurrently.

In one embodiment, the write self-time decoder 18 is combined with the decoder 16 such that the decoder 18 performs the functions of both the decoder 18 and the write self-time decoder 18. In this embodiment, the decoder 12 may concurrently transmit the word line signal to both the memory array 12 and the write self-time bit cell 20. The secondary word line signal is no longer used in this embodiment.

The write self-time bit cell 20 is communicatively coupled to the write self-time decoder 18 and the write self-time detector 22. The write self-time bit cell 20 is a dummy bit cell that simulates each of the bit cells in the memory array 12. The write self-time bit cell 20 is used to track a write self-time of bit cells of the memory array 12. Stated differently, the write self-time bit cell 20 estimates a duration of time to perform a successful write operation to a bit cell of the memory array 12. The write self-time bit cell 20 estimates the write self-time to the bit cells of the memory array 12 by performing a simulated write operation to itself. The time duration to perform the simulated write operation is an estimate of the write self-time of each of the bit cells of the memory array 12.

The write self-time bit cell 20 receives the secondary word line signal from the write self-time decoder 18. In response to receiving the secondary word line signal from the write self-time decoder 18 (e.g., the secondary word line signal having a high state), the write self-time bit cell 20 performs the simulated write operation. The simulated write operation is performed concurrently with the write operation performed by the memory array 12. State differently, the simulated write operation and the write operation are started at the same time.

It is noted that, unlike data stored in the memory array 12, the data written to the write self-time bit cell 20 by the simulated write operation is not used by the memory device 10 (e.g., the data is not read out to be used for other processing). Rather, the data written by the simulated write operation is dummy data that is used for the purpose of estimating the write self-time of each of the bit cells of the memory array 12.

The write self-time bit cell 20 has the same structure and arrangement as each of the bit cells of the memory array 12. The structure and operation of the write self-time bit cell 20 will be discussed in further detail below.

The write self-time detector 22 is communicatively coupled to the write self-time bit cell 20 and the controller 14. The write self-time detector 22 detects completion of the simulated write operation performed by the write self-time bit cell 20. In particular, the write self-time detector 22 detects completion of the simulated write operation based on a write detect signal in the write self-time bit cell 20. For example, the write self-time detector 22 detects completion of the simulated write operation in response to detecting a falling edge of the write detect signal (e.g., the write detect signal going to a low state). The write detect signal will be discussed in further detail below.

The write self-time detector 22 informs the controller 14 of the completion of the simulated write operation performed by the write self-time bit cell 20. The controller 14 in turn instructs the decoder 16 to end the write operation to the memory array 12. To end the write operation, the controller 14 instructs the decoder 16 to stop transmitting the word line signal to the memory array 12 (e.g., set the word line signal to a low state), also referred to as a reset operation. The controller 14 instructs the decoder 16 by, for example, resetting or stopping the interrupt or clock signal used to start the write operation. Upon no longer receiving the word line signal from the decoder 16, the memory array 12 stops the write operation to the bit cells of the memory array 12. The decoder 12 also instructs the write self-time decoder 18 to stop transmission of the secondary word line signal to the write self-time bit cell 20 at this time in order to stop the simulated write operation.

The simulated write operation performed by the write self-time bit cell 20 is performed in the same manner as the write operation performed by the memory array 12. Further, the write self-time bit cell 20 has the same or substantially similar structure and arrangement as each of the bit cells of the memory array 12. Thus, write operations performed by the write self-time bit cell 20 and the memory array 12 are affected by PVT conditions in a similar manner. As a result, the time duration to complete the simulated write operation by the write self-time bit cell 20 provides an accurate estimate of the write self-time of the bit cells of the memory array 12 (i.e., of the time duration of the write operation performed by the memory array 12).

Accordingly, stopping of the write operation to the memory array 12 before the write operation has completed and stopping of the write operation substantially after the write operation has completed may be avoided. As discussed above, if the write self-time delay is less than the time duration for a successful write operation, the reset operation will occur before data has been properly written to the bit cell and result in data loss. Conversely, if the write self-time delay is substantially more that the time duration for a successful write operation, the memory device will be operating longer than is necessary and result in power and performance loss.

Figure 2:
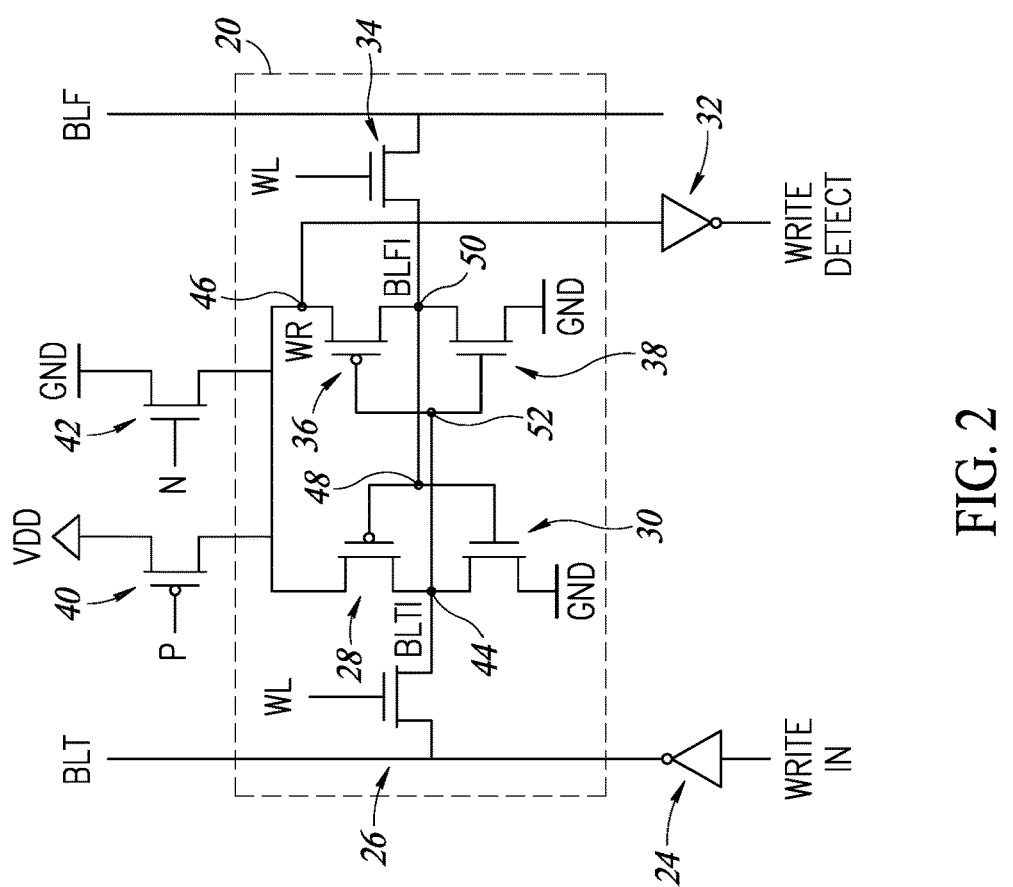
FIG. 2 is a circuit diagram of a write self-time bit cell according to an embodiment disclosed herein.

FIG. 2 is a circuit diagram of the write self-time bit cell 20 according to an embodiment disclosed herein.

The write self-time bit cell 20 has a structure similar to that of a six transistor (6T) bit cell. The write self-time bit cell 20 includes a first word line transistor 26, a first storing transistor 28, a second storing transistor 30, a second word line transistor 34, a third storing transistor 36, and a fourth storing transistor 38. The write self-time bit cell 20 is electrically coupled to a write inverter 24, a write detect inverter 32, an input voltage transistor 40, and a ground transistor 42.

The write inverter 24 is electrically coupled to a first bit line BLT. The write inverter 24 is configured to receive a write in signal that drives the first bit line BLT to store a bit. In FIG. 2, a 1 bit is being stored in the write self-time bit cell 20 by, for example, a node voltage BLTI at a first node 44.

The first word line transistor 26 is electrically coupled between the first bit line BLT and the first node 44. In particular, a first conductive terminal of the first word line transistor 26 is electrically coupled to the first bit line BLT, and a second conductive terminal of the first word line transistor 26 is electrically coupled to the first node 44. A control terminal of the first word line transistor 26 is configured to receive a word line signal WL (e.g., the word line signal or the secondary word line signal discussed above). As will be discussed in further detail below, the simulated write operation is started upon the word line signal WL being applied to the control terminal of the first word line transistor 26 and the control terminal of the second word line transistor 34. The first word line transistor 26 is a n-type transistor, such as a NMOS.

The first storing transistor 28 is electrically coupled between the first node 44 and a second node 46. In particular, a first conductive terminal of the first storing transistor 28 is electrically coupled to the first node 44, and a second conductive terminal of the first storing transistor 28 is electrically coupled to the second node 46. A control terminal of the first storing transistor 28 is electrically coupled to a third node 48. The first storing transistor 28 is a p-type transistor, such as PMOS.

The second storing transistor 30 is electrically coupled between the first node 44 and ground GND. In particular, a first conductive terminal of the second storing transistor 30 is electrically coupled to the first node 44, and a second conductive terminal of the second storing transistor 30 is electrically coupled to ground GND. A control terminal of the second storing transistor 30 is electrically coupled to a third node 48. The second storing transistor 30 is a n-type transistor, such as a NMOS.

The write detect inverter 32 is electrically coupled to the second node 46. The write detect inverter 32 is configured to output a write detect signal. The write detect signal indicates a starting and stopping of the simulated write operation performed by the write self-time bit cell 20. For example, a high state of the write detect signal indicates that the simulated write operation is currently being performed. As discussed above, the write self-time detector 22 detects completion of the simulated write operation based on a write detect signal in the write self-time bit cell 20. The write detect signal is generated based on a simulated write signal WR on the second node 46. More specifically, the write detect signal is the inverted signal of the simulated write signal WR on the second node 46. Although an inverter is shown in FIG. 2, the write detect inverter 32 may be any logic which helps detect the transition on the second node 46.

The second word line transistor 34 is electrically coupled between a second bit line BLF and a fourth node 50. In particular, a first conductive terminal of the second word line transistor 34 is electrically coupled to the second bit line BLF, and a second conductive terminal of the second word line transistor 34 is electrically coupled to the fourth node 50. During the simulated write operation, the first bit line BLT and the second bit line BLF are complementary to each other. A control terminal of the second word line transistor 34 is configured to receive the word line signal (e.g., the word line signal or the secondary word line signal discussed above). As will be discussed in further detail below, the simulated write operation is started upon the word line signal WL being applied to the control terminal of the first word line transistor 26 and the control terminal of the second word line transistor 34. The first word line transistor 26 is a n-type transistor, such as a NMOS.

The third storing transistor 36 is electrically coupled between the second node 46 and the fourth node 50. In particular, a first conductive terminal of the third storing transistor 36 is electrically coupled to the second node 46, and a second conductive terminal of the third storing transistor 36 is electrically coupled to the fourth node 50. A control terminal of the third storing transistor 36 is electrically coupled to a fifth node 52. The fifth node 52 is electrically coupled to the first node 44. The third storing transistor 36 is a p-type transistor, such as PMOS.

The fourth storing transistor 38 is electrically coupled between the fourth node 50 and ground GND. In particular, a first conductive terminal of the fourth storing transistor 38 is electrically coupled to the fourth node 50, and a second conductive terminal of the fourth storing transistor 38 is electrically coupled to ground GND. A control terminal of the fourth storing transistor 38 is electrically coupled to a fifth node 52. The fourth storing transistor 38 is a n-type transistor, such as a NMOS.

The input voltage transistor 40 is electrically coupled between a voltage input VDD and the second node 46. In particular, a first conductive terminal of the input voltage transistor 40 is electrically coupled to the voltage input VDD, and a second conductive terminal of the input voltage transistor 40 is electrically coupled to the second node 46. A control terminal of the input voltage transistor 40 is config- ured to receive a first clear signal P. The input voltage transistor 40 is a p-type transistor, such as PMOS. The input voltage transistor 40 may be a logic-based device, a memory based device or combination of both. The ground transistor 42 is electrically coupled between ground GND and the second node 46. In particular, a first conductive terminal of the ground transistor 42 is electrically coupled to ground GND, and a second conductive terminal of the ground transistor 42 is electrically coupled to the second node 46. A control terminal of the ground transistor 42 is configured to receive a second clear signal N. The ground transistor 42 is a n-type transistor, such as a NMOS. The ground transistor 42 may be a logic-based device, a memory based device or combination of both.

The first clear signal P and the second clear signal N are used to clear or settle any residual electrical charges in the write self-time bit cell 20, and set the write self-time bit cell 20 to a steady state. As will be discussed in further detail below, the first clear signal P and the second clear signal N are set to a high state prior to initiation of the word line signal.

During the simulated write operation discussed above, the first storing transistor 28 and the second storing transistor 30 are complementary with the third storing transistor 36 and the fourth storing transistor 38. For example, in FIG. 2, a 1 bit is being stored in the write self-time bit cell 20. In this case, the node voltage BLTI at the first node 44 is set to a 1 bit (e.g., the voltage input VDD), and the node voltage BLFI at the fourth node 50 is set to a 0 bit (e.g., ground GND).

The write self-time bit cell 20 has the same structure and arrangement as each of the bit cells of the memory array 12. Stated differently, each of the bit cells of the memory array 12 has the same circuit arrangement as shown in FIG. 2. Accordingly, in one embodiment, the write self-time bit cell 20 and each of the bit cells of the memory array 12 are fabricated using the same fabrication process in the same substrate.

Other circuit arrangements for the write self-time bit cell 20 and each of the bit cells of the memory array 12 are also possible. For example, instead of the 6T bit cell arrangement as shown in FIG. 2, the write self-time bit cell 20 and each of the bit cells of the memory array 12 may have any bit cell arrangement, such as a 4T bit cell, a 8T bit cell, etc. . . . As long as the write self-time bit cell 20 and each of the bit cells of the memory array 12 have the same structure and arrange- ment, the duration of the simulated write operation per- formed by the write self-time bit cell 20 will provide an accurate estimate of the duration of a write operation per- formed by each of bit cells of the memory array 12.

Figure 3:
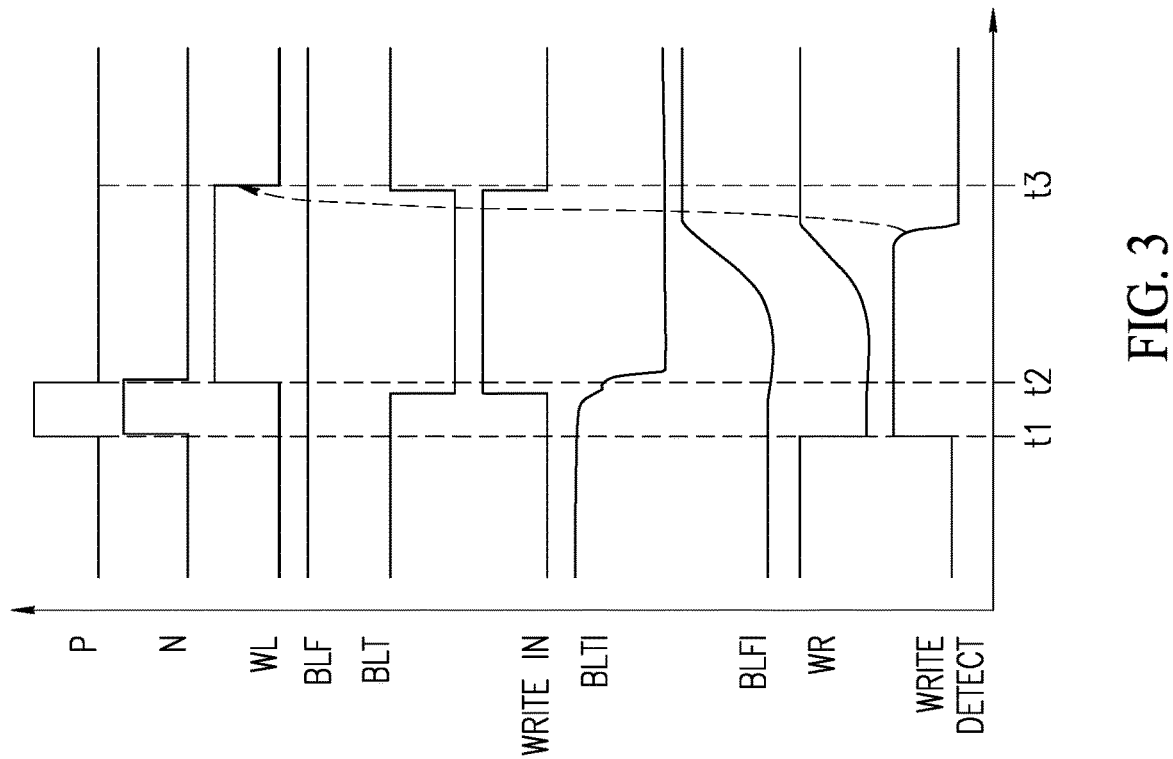
FIG. 3 is a signal diagram of a write self-time bit cell according to an embodiment disclosed herein.

FIG. 3 is a signal diagram of the write self-time bit cell 20 according to an embodiment disclosed herein.

The horizontal axis is a time axis that indicates time or a number of samples. The horizontal axis may have any type of time unit, such as seconds, number of samples, etc. The vertical axis is an amplitude axis that indicates the amplitude of various signals of the write self-time bit cell 20. The vertical axis may have any type of unit, such as volts, amps, etc.

The signals shown in FIG. 3 show the first clear signal P, the second clear signal N, the secondary word line signal WL, the signal on the second bit line BLF, the signal on the first bit line BLT, the write in signal, the node voltage BLTI at the first node 44, the node voltage BLFI at the fourth node 50, the simulated write signal WR, and the write detect signal. The signals are during a simulated write operation that writes a 1 bit to the write self-time bit cell 20.

At time t1, the write self-time bit cell 20 is initialized for operation.

The first clear signal P and the second clear signal N are applied to the control terminal of the input voltage transistor 40 and the control terminal of the ground transistor 42, respectively, at time t1. As shown in FIG. 3, the first clear signal P and the second clear signal N have a high state (e.g., 3 to 5 volts) at time t1.

The simulated write signal WR on the second node 46 also drops to a low state (e.g., ground) at time t1.

The write detect signal is the inverted signal of the simulated write signal WR on the second node 46, and, thus, has a high state at time t1.

At time t2, writing of a 0 bit for the node voltage BLTI at the first node 44 (or a 1 bit at the node voltage BLFI at the fourth node 50) of the write self-time bit cell 20 is started.

The first clear signal P and the second clear signal N are no longer applied to the control terminal of the input voltage transistor 40 and the control terminal of the ground transistor 42, respectively, at time t2. As shown in FIG. 3, the first clear signal P and the second clear signal N are set to a low state (e.g., ground) at time t2.

The write in signal is applied to the write inverter 24 at time t2 (or prior to time t2). As shown in FIG. 3, the write in signal has a high state at time t2. The write in signal drives the first bit line BLT to store a bit.

As a 0 bit is being written to the node voltage BLTI at the first node 44 (or a 1 bit at the node voltage BLFI at the fourth node 50), at time t2 (or prior to time t2), the signal on the second bit line BLF remains at a high state, and the signal on the first bit line BLT drops to a low state (e.g., ground). The first bit line BLT and the second bit line BLF are complementary to each other during the simulated write operation.

The secondary word line signal WL is applied to the control terminal of the first word line transistor 26 and the control terminal of the second word line transistor 34 at time t2. As shown in FIG. 3, the secondary word line signal WL has a high state at time t2. As a result, the writing of the 1 bit to the write self-time bit cell 20 is started.

The node voltage BLTI at the first node 44 starts to drop to a low state at time t2, and the node voltage BLFI at the fourth node 50 starts to rise to a high state at time t2.

Between time t2 and time t3, the simulated write operation writes the 1 bit to the write self-time bit cell 20.

During time t2 and time t3, the simulated write signal WR on the second node 46 rises to a high state again. In response to the simulated write signal WR reaching a threshold value, the write detect signal drops back to a low state.

As discussed above, the write self-time detector 22 detects completion of the simulated write operation based on a write detect signal in the write self-time bit cell 20. The write self-time detector 22 detects completion of the simulated write operation in response to detecting the write detect signal falling below a threshold value, after the secondary word signal WL is applied to the control terminal of the first word line transistor 26 and the control terminal of the second word line transistor 34 at time t2.

The write self-time detector 22 informs the controller 14 of the completion of the simulated write operation, in response to the write self-time detector 22 detecting completion of the simulated write operation. The controller 14 in turn instructs the decoder 16 to end the write operation to the memory array 12. To end the write operation, the controller 14 instructs the decoder 16 to stop transmitting the word line signal to the memory array 12. Upon no longer receiving the word line signal from the decoder 16 at time t3, the memory array 12 stops the write operation to the bit cells of the memory array 12.

Concurrently, the decoder 16 instructs the write self-time decoder 18 to also stop transmission of the secondary word line signal WL to the write self-time bit cell 20 in order to stop the simulated write operation. Upon no longer receiving the secondary word line signal WL from the write self-time decoder 18 at time t3, the write self-time bit cell 20 stops the simulated write operation. As shown in FIG. 3, the secondary word line signal WL returns to a low state at time t3.

As the write operation to the memory array 12 and the simulated write operation to the write self-time bit cell 20 are performed concurrently, the word line signal applied to the memory array 12 has the same signal profile as the secondary word line signal WL shown in FIG. 3.

As discussed above, current devices, which utilize logic and/or RC delay techniques (e.g., two inverters electrically coupled in series), generally tune the write self-time delay with large margins to account for worst case PVT conditions in order to ensure a write operation has enough time to be successfully completed before triggering the reset operation. Consequently, the reset operation is often unnecessarily delayed and causes loss in power and performance. In contrast, the reset operation of the memory array 12 discussed above is stopped based on the simulated write operation to the write self-time bit cell 20. As the simulated write operation closely tracks and provides an accurate estimate of the write operation to the memory array 12, the decoder 16 stops transmitting the word line signal to the memory array 12 immediately after data has been successfully written to the memory array 12 (i.e., without unnecessary delay). Accordingly, loss in power and performance due to the unnecessary delays in reset operations is minimized.

Although a single write self-time bit cell 20 is shown in FIGS. 1 and 2, the memory device 10 may include any number of the write self-time bit cells 20. Utilizing multiple write self-time bit cells 20 in parallel connection provides robustness against variation of bit cells for the simulated write operation and minimizes false detections by the write self-time detector 22.

Figure 4:
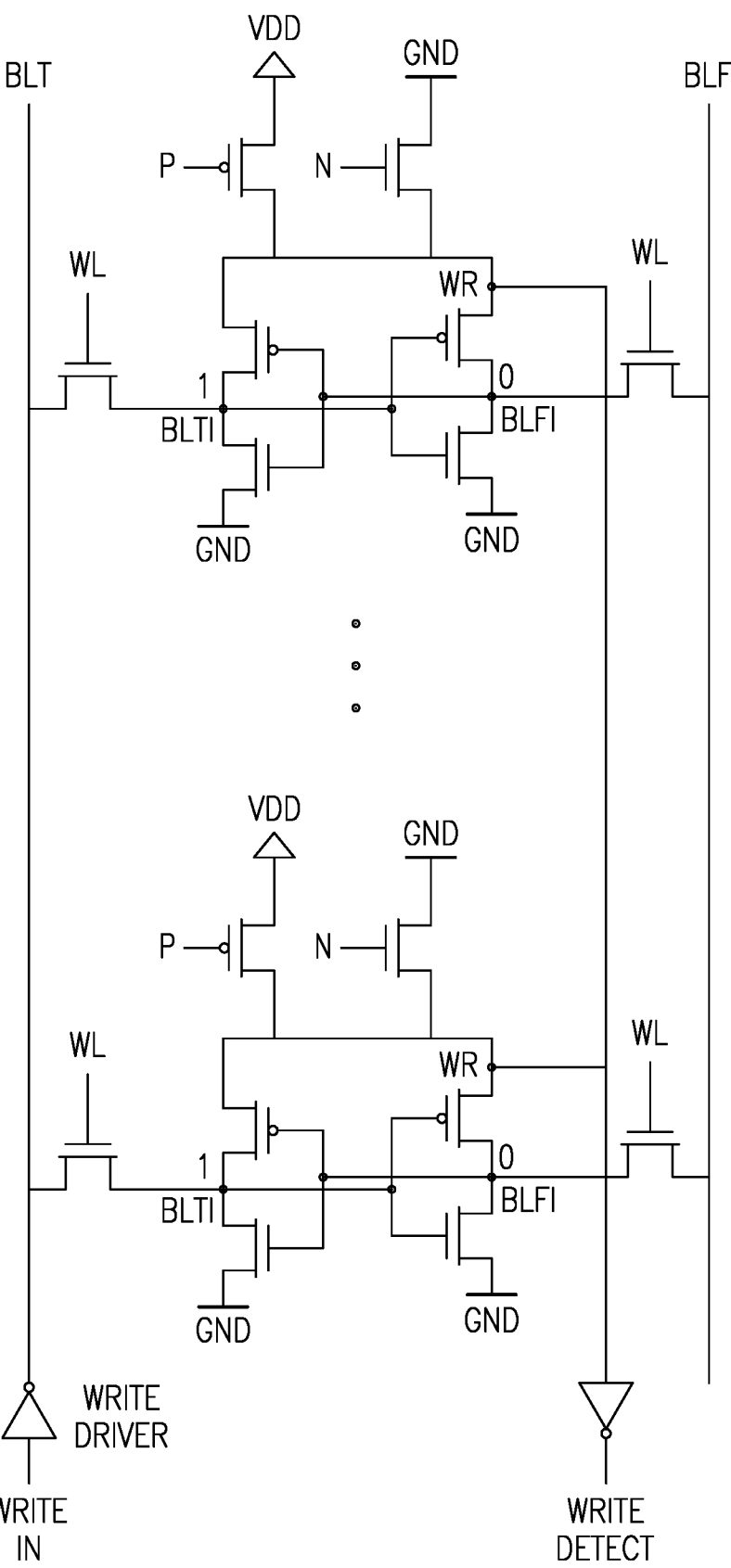
FIG. 4 is a circuit diagram of a plurality of write self-time bit cells according to an embodiment disclosed herein.

FIG. 4 is a circuit diagram of a plurality of write self-time bit cells 20 according to an embodiment disclosed herein.

The structure and functionality of each of the write self-time bit cells 20 are the same as that discussed above with respect to FIGS. 1 to 3. Namely, the plurality of write self-time bit cells 20 are communicatively coupled to the write self-time decoder 18 and the write self-time detector 22 as discussed with respect to FIG. 1, each of the plurality of write self-time bit cells 20 have a circuit arrangement as discussed with respect to FIG. 2, and each of the plurality of write self-time bit cells 20 operate as discussed with respect to FIG. 3.

As shown in FIG. 4, the plurality of write self-time bit cells 20 are arranged in parallel with each other. The first conductive terminals of the first word line transistors 26 are electrically coupled to the first bit line BLT. The first conductive terminals of the second word line transistor 34 are electrically coupled to the second bit line BLF.

In this embodiment, the write self-time decoder 18 transmits the secondary word line signal to each of the plurality of write self-time bit cells 20, and the write self-time detector 22 detects completion of the simulated write operation performed by each of the plurality of the write self-time bit cells 20. The write self-time detector 22 then informs the controller 14 of the completion of the simulated write operation performed by the plurality of the write self-time bit cells 20.

In one embodiment, the write self-time detector 22 informs the controller 14 of the completion of the simulated write operation in response to detecting any one of the simulated write operations performed by the plurality of the write self-time bit cells 20 is completed. In one embodiment, the write self-time detector 22 informs the controller 14 of the completion of the simulated write operation in response to detecting all of the simulated write operations performed by the plurality of the write self-time bit cells 20 are completed.

The various embodiments described above provide a device and method for accurately estimating a write self-time of a memory array. The write self-time is estimated by performing a simulated write operation on a write self-time bit cell having the same structure and arrangement as each of the bit cells of the memory array. Write operations on the bit cells of the memory array are stopped in response to detecting completion of the simulated write operation. As the write self-time bit cell has the same structure and arrangement as each of the bit cells of the memory array, the simulated write operation performed on the write self-time bit cell and write operations performed on the memory array are affected by PVT conditions in a similar manner. As a result, the time duration to complete the simulated write operation provides an accurate estimate of the write self-time of each of the bit cells of the memory array.

A device may be summarized as including a first bit line; a second bit line; a write self-time bit cell electrically coupled between the first bit line and the second bit line; a write inverter electrically coupled to the first bit line, the write inverter configured to receive a write in signal; a write detect inverter electrically coupled to a first node of the write self-time bit cell, the write detect inverter configured to output a write detect signal; an input voltage transistor electrically coupled to the first node and an input voltage; and a ground transistor electrically coupled to the first node and ground.

The input voltage transistor may be a p-type transistor, and the ground transistor may be an n-type transistor.

The write self-time bit cell may have a first circuit arrangement including a first word line transistor electrically coupled between the first bit line and a second node; a first storing transistor electrically coupled between the first node and the second node; a second storing transistor electrically coupled to the second node and ground; a second word line transistor electrically coupled between the second bit line and a third node; a third storing transistor electrically coupled between the first node and the third node; and a fourth storing transistor electrically coupled between the third node and ground.

Control terminals of the first storing transistor and the second storing transistor may be electrically coupled to the third node.

Control terminals of the third storing transistor and the fourth storing transistor may be electrically coupled to the second node.

The first storing transistor and the third storing transistor may be p-type transistors, and the second storing transistor and the fourth storing transistor may be n-type transistors.

The first word line transistor and the second word line transistor may be n-type transistors.

The device may further include a memory array including a plurality of bit cells, each of the plurality of bit cells have a second circuit arrangement that is the same as the first circuit arrangement.

The device may further include a memory array including a plurality of bit cells, each of the plurality of bit cells having the same circuit arrangement as the write self-time bit cell.

Control terminals of the first word line transistor and the second word line transistor may be configured to receive a word line signal.

A device may be summarized as including a first bit line; a second bit line; a plurality of write self-time bit cells electrically coupled between the first bit line and the second bit line, the plurality of write self-time bit cells being electrically coupled to each other in parallel; a write inverter electrically coupled to the first bit line, the write inverter configured to receive a write in signal; a write detect inverter electrically coupled to respective first nodes of the plurality of write self-time bit cells, the write detect inverter configured to output a write detect signal; a plurality of input voltage transistors electrically coupled to respective first nodes of the plurality of write self-time bit cells and an input voltage; and a plurality of ground transistors electrically coupled to respective first nodes of the plurality of write self-time bit cells and ground.

Each of the plurality of write self-time bit cell may have a first circuit arrangement including a first word line transistor electrically coupled between the first bit line and a second node; a first storing transistor electrically coupled between the first node and the second node; a second storing transistor electrically coupled to the second node and ground; a second word line transistor electrically coupled between the second bit line and a third node; a third storing transistor electrically coupled between the first node and the third node; and a fourth storing transistor electrically coupled between the third node and ground.

The device may further include a memory array including a plurality of bit cells, each of the plurality of bit cells have a second circuit arrangement that is the same as the first circuit arrangement.

The device may further include a memory array including a plurality of bit cells, each of the plurality of bit cells having the same circuit arrangement as each of the plurality of write self-time bit cells.

A device may be summarized as including a first bit line; a second bit line; a write self-time bit cell electrically coupled between the first bit line and the second bit line; a write inverter electrically coupled to the first bit line, the write inverter configured to receive a write in signal; a write detect inverter electrically coupled to a first node of the write self-time bit cell, the write detect inverter configured to output a write detect signal; an input voltage transistor electrically coupled to the first node and an input voltage; a ground transistor electrically coupled to the first node and ground; a memory array including a plurality of bit cells, each of the plurality of bit cells having the same circuit arrangement as the write self-time bit cell; and a controller configured to control a write operation to at least one of the plurality of bit cells based on the write detect signal.

The controller may be configured to stop the write operation to at least one of the plurality of bit cells based on the write detect signal.

The write self-time bit cell may have a circuit arrangement including a first word line transistor electrically coupled between the first bit line and a second node; a first storing transistor electrically coupled between the first node and the second node; a second storing transistor electrically coupled to the second node and ground; a second word line transistor electrically coupled between the second bit line and a third node; a third storing transistor electrically coupled between the first node and the third node; and a fourth storing transistor electrically coupled between the third node and ground.

A device may be summarized as including a memory array including a plurality of bit cells; a decoder configured to transmit a first word line signal to the memory array, the memory array configured to perform a first write operation to at least one of the plurality of bit cells in response to receiving the first word line signal; a write self-time bit cell; a write self-time decoder configured to transmit a second word line signal to the write self-time bit cell, the write self-time bit cell configured to perform a second write operation to the write self-time bit cell in response to receiving the second word line signal; a write self-time detector configured to detect completion of the second write operation; and a controller configured to stop the first write operation in response to the completion of the second write operation being detected by the write self-time detector.

Each of the plurality of bit cells may have the same circuit arrangement as the write self-time bit cell.

The first write operation and the second write operation may be performed concurrently.

A method may be summarized as including transmitting a first word line signal to a memory array including a plurality of bit cells; performing, by the memory array, a first write operation to at least one of the plurality of bit cells in response to receiving the first word line signal; transmitting a second word line signal to a write self-time bit cell; performing, by the write self-time bit cell, a second write operation to the write self-time bit cell in response to receiving the second word line signal; detecting a completion of the second write operation; and stopping the first write operation in response to detecting the completion of the second write operation.

Each of the plurality of bit cells may have the same circuit arrangement as the write self-time bit cell.

The first write operation and the second write operation are performed concurrently.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first bit line;
a second bit line;
a write self-time bit cell electrically coupled between the first bit line and the second bit line and including a first invert and a second inverter cross-coupled together between a high-supply node and ground;
a write inverter electrically coupled to the first bit line, the write inverter configured to receive a write in signal;
a write detect inverter having an input electrically coupled to the high supply node of the write self-time bit cell, the write detect inverter configured to output a write detect signal;
an input voltage transistor having a source terminal coupled to a high supply voltage, a drain terminal coupled to the high supply node, and a gate terminal coupled to receive a first control signal; and
a ground transistor having a source terminal coupled to ground, a drain terminal coupled to the high supply node, and a gate terminal coupled to receive a second control signal.

2. The device of claim 1 wherein the input voltage transistor is a p-type transistor, and the ground transistor is an n-type transistor.

3. The device of claim 1 wherein the write self-time bit cell has a first circuit arrangement including:
a first word line transistor electrically coupled between the first bit line and an output of the first inverter;
a first storing transistor of the first inverter electrically coupled between the high supply voltage node and the output of the first inverter;
a second storing transistor electrically coupled to the output of the first inverter and ground;
a second word line transistor electrically coupled between the second bit line and an output of the second inverter;
a third storing transistor electrically coupled between the high supply node and the output of the first inverter; and
a fourth storing transistor electrically coupled between the output of the first inverter and ground.

4. The device of claim 3 wherein control terminals of the first storing transistor and the second storing transistor are electrically coupled to the output of the second inverter.

5. The device of claim 3 wherein control terminals of the third storing transistor and the fourth storing transistor are electrically coupled to the output of the first inverter.

6. The device of claim 3 wherein the first storing transistor and the third storing transistor are p-type transistors, and the second storing transistor and the fourth storing transistor are n-type transistors.

7. The device of claim 3 wherein the first word line transistor and the second word line transistor are n-type transistors.

8. The device of claim 3, further comprising:
a memory array including a plurality of bit cells, each of the plurality of bit cells have a second circuit arrangement that is the same as the first circuit arrangement.

9. The device of claim 1, further comprising:
a memory array including a plurality of bit cells, each of the plurality of bit cells having the same circuit arrangement as the write self-time bit cell.

10. The device of claim 3 wherein control terminals of the first word line transistor and the second word line transistor are configured to receive a word line signal.

11. A device comprising:
a first bit line;
a second bit line;
a plurality of write self-time bit cells electrically coupled between the first bit line and the second bit line, the plurality of write self-time bit cells being electrically coupled to each other in parallel, each write self-time bit cell including a first invert and a second inverter cross-coupled together between a high-supply node and ground;
a write inverter electrically coupled to the first bit line, the write inverter configured to receive a write in signal;
a write detect inverter having an input electrically coupled to respective high supply nodes of the plurality of write self-time bit cells, the write detect inverter configured to output a write detect signal;
a plurality of input voltage transistors electrically each having a source terminal coupled to respective high supply nodes of the plurality of write self-time bit cells and high supply voltage; and
a plurality of ground transistors electrically each having a source terminal coupled to ground, a drain terminal coupled to a respective high supply node, and a gate terminal coupled to receive a second control signal.

12. The device of claim 11 wherein each of the plurality of write self-time bit cell has a first circuit arrangement including:
a first word line transistor electrically coupled between the first bit line and an output of the first inverter;
a first storing transistor of the first inverter electrically coupled between the high supply voltage node and the output of the first inverter;
a second storing transistor electrically coupled to the output of the first inverter and ground;
a second word line transistor electrically coupled between the second bit line and an output of the second inverter;
a third storing transistor electrically coupled between the high supply node and the output of the first inverter; and
a fourth storing transistor electrically coupled between the output of the first inverter and ground.

13. The device of claim 12, further comprising:
a memory array including a plurality of bit cells, each of the plurality of bit cells have a second circuit arrangement that is the same as the first circuit arrangement.

14. The device of claim 11, further comprising:
a memory array including a plurality of bit cells, each of the plurality of bit cells having the same circuit arrangement as each of the plurality of write self-time bit cells.

15. A device, comprising:
a first bit line;
a second bit line;
a write self-time bit cell electrically coupled between the first bit line and the second bit line and including a first invert and a second inverter cross-coupled together between a high-supply node and ground;

a write inverter electrically coupled to the first bit line, the write inverter configured to receive a write in signal;

a write detect inverter having an input electrically coupled to the high supply node of the write self-time bit cell, the write detect inverter configured to output a write detect signal;

an input voltage transistor having a source terminal coupled to a high supply voltage, a drain terminal coupled to the high supply node, and a gate terminal coupled to receive a first control signal;

a ground transistor having a source terminal coupled to ground, a drain terminal coupled to the high supply node, and a gate terminal coupled to receive a second control signal;

a memory array including a plurality of bit cells, each of the plurality of bit cells having the same circuit arrangement as the write self-time bit cell; and a controller configured to control a write operation to at least one of the plurality of bit cells based on the write detect signal.

16. The device of claim 15 wherein the controller is configured to stop the write operation to at least one of the plurality of bit cells based on the write detect signal.

17. The device of claim 15 wherein the write self-time bit cell has a circuit arrangement including:

a first word line transistor electrically coupled between the first bit line and an output of the first inverter;

a first storing transistor of the first inverter electrically coupled between the high supply voltage node and the output of the first inverter;

a second storing transistor electrically coupled to the output of the first inverter and ground;

a second word line transistor electrically coupled between the second bit line and an output of the second inverter;

a third storing transistor electrically coupled between the high supply node and the output of the first inverter; and a fourth storing transistor electrically coupled between the output of the first inverter and ground.

18. The device of claim 17 wherein control terminals of the first storing transistor and the second storing transistor are electrically coupled to the output of the second inverter.

19. The device of claim 17 wherein control terminals of the third storing transistor and the fourth storing transistor are electrically coupled to the output of the first inverter.

20. The device of claim 17 wherein the first storing transistor and the third storing transistor are p-type transistors, and the second storing transistor and the fourth storing transistor are n-type transistors.

* * * * *